(12) United States Patent
Guan et al.

(10) Patent No.: US 11,436,973 B2
(45) Date of Patent: Sep. 6, 2022

(54) REPAIRABLE GOA DRIVE SYSTEM, DRIVING METHOD FOR GOA CIRCUIT, AND DISPLAY PANEL

(71) Applicant: SHENZHEN ROYOLE TECHNOLOGIES CO., LTD., Guangdong (CN)

(72) Inventors: Ximeng Guan, Guangdong (CN); Jigang Zhao, Guangdong (CN)

(73) Assignee: SHENZHEN ROYOLE TECHNOLOGIES CO., LTD., Guangdon (CN)

( * ) Notice: Subject to any disclaimer, the term of this patent is extended or adjusted under 35 U.S.C. 154(b) by 0 days.

(21) Appl. No.: 17/413,465

(22) PCT Filed: Dec. 13, 2018

(86) PCT No.: PCT/CN2018/120869
§ 371 (c)(1),
(2) Date: Jun. 11, 2021

(87) PCT Pub. No.: WO2020/118612
PCT Pub. Date: Jun. 18, 2020

(65) Prior Publication Data
US 2022/0059019 A1      Feb. 24, 2022

(51) Int. Cl.
*G09G 3/32*       (2016.01)
*G11C 19/28*      (2006.01)

(52) U.S. Cl.
CPC ............ *G09G 3/32* (2013.01); *G11C 19/28* (2013.01); *G09G 2300/0408* (2013.01);
(Continued)

(58) Field of Classification Search
CPC ............ G09G 3/32; G09G 2300/0408; G09G 2310/0267; G09G 2310/0286; G09G 2330/08; G11C 19/28
See application file for complete search history.

(56) References Cited

U.S. PATENT DOCUMENTS 11,211,022 B2 * 12/2021 Xiong .................. G09G 3/3677

FOREIGN PATENT DOCUMENTS

| CN | 1602512 | 3/2005 |
| CN | 101004492 | 7/2007 |

(Continued)

OTHER PUBLICATIONS

International Search Report of PCT/CN2018/120869 dated Sep. 11, 2019, 4 pages.

*Primary Examiner* — Kenneth B Lee, Jr.
(74) *Attorney, Agent, or Firm* — Rankin, Hill & Clark LLP

(57) ABSTRACT

The present invention relates to a repairable GOA drive system, a driving method for a GOA circuit, and a display panel, which are used to improve the yield of display panels in a manufacturing process. The display panel includes a display area and a pixel circuit arranged in the display area, and the repairable GOA drive system includes a GOA circuit, a repair circuit, and a driver IC. The GOA circuit is connected to a driving signal output end of the driver IC; and the repair circuit is arranged between the driver IC and the pixel circuit and configured to replace at least one abnormal GOA unit in the GOA circuit to output a driving signal to the corresponding pixel circuit when the at least one GOA unit is abnormal. The implementation of the present invention can greatly improve repairability of backplane circuits with a GOA and increase the screen yield in mass production.

14 Claims, 9 Drawing Sheets

(52) U.S. Cl.
CPC ............... *G09G 2310/0267* (2013.01); *G09G 2310/0286* (2013.01); *G09G 2330/08* (2013.01)

(56) References Cited

FOREIGN PATENT DOCUMENTS

| | | |
|---|---|---|
| CN | 101295489 | 10/2008 |
| CN | 104409065 | 3/2015 |
| KR | 20080033730 | 4/2008 |

\* cited by examiner

REPAIRABLE GOA DRIVE SYSTEM, DRIVING METHOD FOR GOA CIRCUIT, AND DISPLAY PANEL

TECHNICAL FIELD

The present invention relates to the field of display panel technologies, and in particular, to a repairable GOA drive system, a driving method for a GOA circuit, and a display panel.

BACKGROUND

The yield of display panels has decisive significance to manufacturing costs of the panels. If process defects or random errors occur, a circuit on the display panel may malfunction, resulting in a defective panel. If methods for detecting and repairing defects are available in the production process, the factory yield of the display panels can be significantly improved. In a conventional display panel technology, when a gate line driving signal is provided by an integrated circuit (generally called a gate driver IC) outside a panel, gate line defects caused by short circuits and open circuits can be repaired in a relatively simple manner.

Specifically, a spare repair line may be preset on the panel and connected to a spare pin of the driver IC. When a gate line between the driver IC and an area AA (display area) fails, an original connection between the gate line and the driver IC is interrupted, the gate line is connected to the spare repair line, the driver IC is reconfigured, and a drive pulse is led to the corresponding spare pin and repair line.

As panel technologies evolve, resolutions increase, and a demand for narrow bezels grows, the preceding conventional gate driver IC is replaced by a GOA circuit directly fabricated on the panel. The introduction of the GOA circuit makes it difficult for conventional repair methods to take effect. This is because locations of defects have shifted: the defects occur not only in connecting lines, but also inside the GOA circuit; and the nature of the defects has also shifted: the defects not only include short circuits or open circuits of metal connecting lines, but also may come from failures of thin film transistors (TFTs) that compose the GOA circuit. The working principle of an existing GOA determines that a defect is propagated on an electrical signal once occurred. Specifically, when a GOA at a certain stage is defective, a subsequent stage driven thereby fails, and then a further subsequent stage also fails. Therefore, once the GOA is defective, an entire screen will almost certainly be scrapped.

The above-mentioned changes greatly increase difficulty in repairing a display panel circuit. Therefore, although the GOA technology brings many advantages to panels, it also poses a new challenge to the yield of the panels.

SUMMARY

The technical issue to be addressed by the present invention is to provide a repairable GOA drive system, a driving method for a GOA circuit, and a display panel against sensitivity of the yield of GOA-based display panels to defects.

To address the technical issues, the present invention uses the following technical solution: a GOA drive system easy to repair, used for a display panel including a display area and a pixel circuit arranged in the display area, where the GOA drive system includes a GOA circuit, a repair circuit, and a driver IC, where the GOA circuit is connected to a driving signal output end of the driver IC; and the repair circuit is arranged between the driver IC and the pixel circuit, and configured to replace at least one abnormal GOA unit in the GOA circuit to output a driving signal to the corresponding pixel circuit when the at least one GOA unit is abnormal.

The present invention further provides a driving method for repairing a GOA circuit, which is applied to the repairable GOA drive system above and includes the following steps:

comparing an input address signal with a stored address of an abnormal GOA unit; and when the input address signal is inconsistent with the address of the abnormal GOA unit:

allowing the address signal to pass and gating a corresponding GOA unit; or when the input address signal is consistent with the address of the abnormal GOA unit:

suppressing the address signal and sending a driving signal to a pixel circuit corresponding to the abnormal GOA unit through a repair line.

The present invention further provides a display panel, including the repairable GOA drive system above.

According to the present invention, the repairable GOA drive system is arranged in the display panel. A GOA circuit structure including a plurality of stages of mutually independent GOA units is adopted, so that the stages are independent of each other in an electrical design, a dependency relationship between former and latter stages is removed, and a defect of a former stage does not lead to a defect of a latter stage; a failure of a single-stage GOA unit can be identified and repaired in electrical inspection after a backplane is completed; moreover, a repair process is simple and highly operable, and additional requirements for the driver IC are simple and highly implementable; and the present invention can greatly improve repairability of backplane circuits with a GOA and increase the screen yield in mass production.

BRIEF DESCRIPTION OF DRAWINGS

The following further describes the present invention with reference to the accompanying drawings and embodiments. Among the accompanying drawings.

DESCRIPTION OF EMBODIMENTS

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
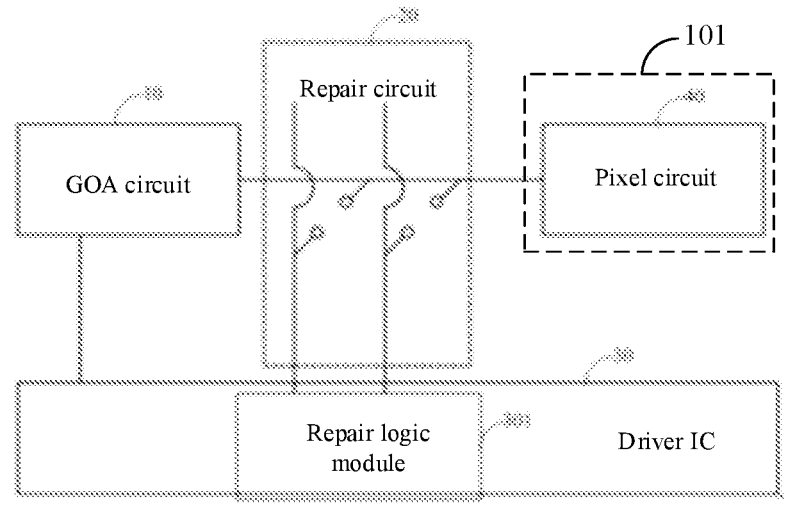
FIG. 1 is a schematic structural diagram illustrating a repairable GOA drive system according to the present invention.

FIG. 1 is a schematic structural diagram illustrating a repairable GOA drive system according to the present invention. The repairable GOA drive system may be applied to a display panel, and specifically, applied to a backplane circuit with a GOA.

Specifically, the repairable GOA drive system may be used for a display panel, where the display panel includes a display area 101 and a pixel circuit 40 arranged in the display area 101.

Figure 2:
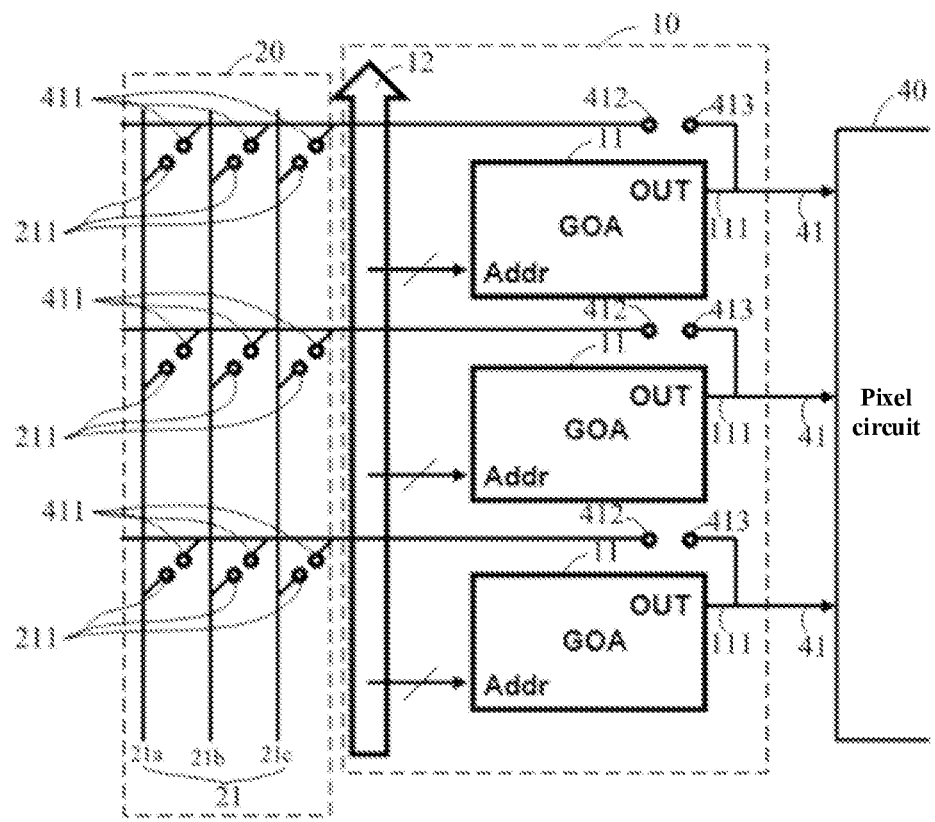
FIG. 2 is a schematic circuit diagram illustrating embodiment 1 of a repair circuit and a GOA circuit in a repairable GOA drive system according to the present invention.

As shown in FIG. 1 and FIG. 2, the repairable GOA drive system may include a GOA circuit 10, a repair circuit 20, and a driver IC (30). The GOA circuit 10 is connected to the driver IC (30). Specifically, an address bus 12 of the GOA circuit 10 is connected to a driving signal output end of the driver IC (30); the repair circuit 20 is arranged between the driver IC (30) and the pixel circuit 40, and the repair circuit 20 is configured to replace at least one abnormal GOA unit 11 in the GOA circuit 10 to output a driving signal to the corresponding pixel circuit 40 when the at least one GOA unit is abnormal. Herein, the corresponding pixel circuit refers to a pixel circuit corresponding to the abnormal GOA unit.

The GOA circuit 10 provided in the embodiment of the present invention is a GOA circuit that is based on complementary polarity transistors and supports random addressing. GOA units 11 at different stages in the GOA circuit 10 are independent of each other in an electrical design, no dependency relationship is stored, and a defect of a certain stage does not lead to a defect of a latter stage.

Figure 3:
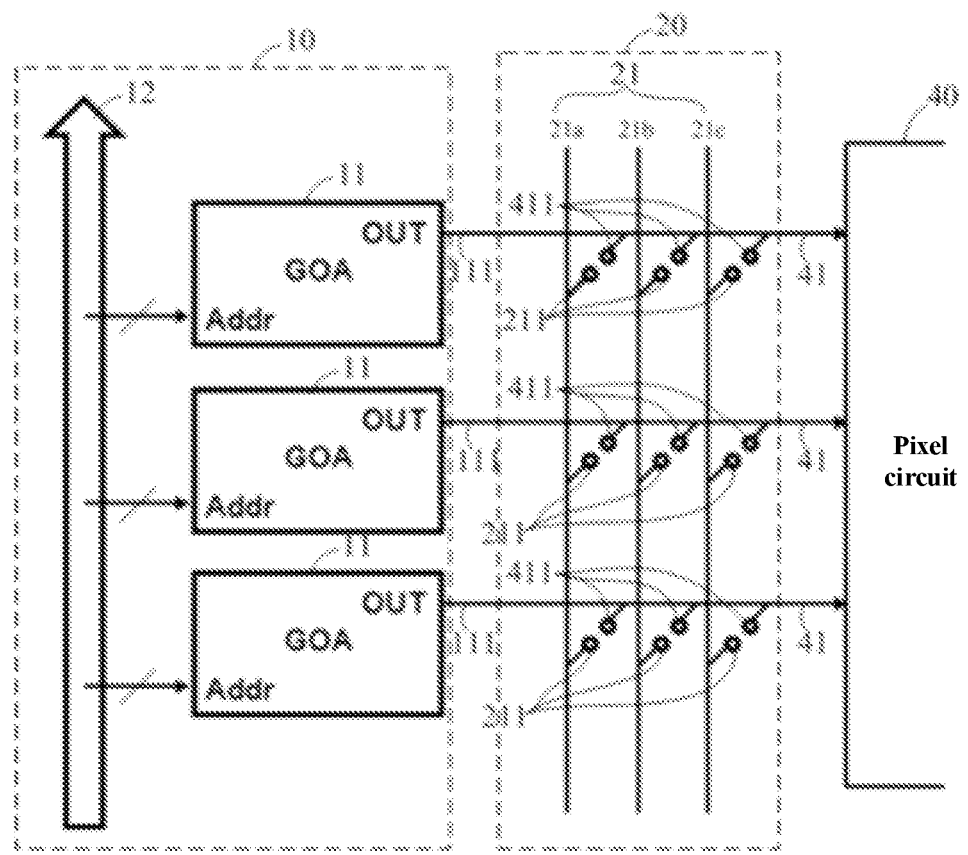
FIG. 3 is a schematic circuit diagram illustrating embodiment 2 of a repair circuit and a GOA circuit in a repairable GOA drive system according to the present invention.

Further, as shown in FIG. 2 and FIG. 3, the GOA circuit 10 in the embodiment of the present invention includes a plurality of stages of mutually independent GOA units 11, a signal input line of the GOA unit 11 at each stage is connected to the address bus 12 of the GOA circuit 10, and a $j^{th}$ stage GOA unit 11 of the GOA circuit 10 correspondingly controls a $j^{th}$ stage horizontal scan line 41 of the pixel circuit 40 in the display area 101; in other words, a signal output line 111 of the $j^{th}$ stage GOA unit 11 is connected to the $j^{th}$ stage horizontal scan line 41 in the pixel circuit 40, and j is any integer greater than or equal to 1. Each GOA unit is independently driven by the driver IC (30) over the address bus 12.

In the embodiment of the present invention, the repair circuit 20 is located between the pixel circuit 40 and the signal output line 111 of each GOA unit 11, and is connected to a repair signal output end of the driver IC (30); when the $j^{th}$ stage GOA unit 11 in the GOA circuit 10 is abnormal, the $j^{th}$ stage GOA unit 11 is disconnected, so that the $j^{th}$ stage GOA unit 11 has no signal output, and the repair circuit 20 is enabled, so that the driver IC (30) transmits, through the repair circuit 20, a driving signal to a horizontal scan line 41 arranged corresponding to the abnormal GOA unit 11 at the stage. For example, assuming that a defect occurs in the $j^{th}$ stage GOA unit 11 in the GOA circuit 10, the $j^{th}$ stage GOA unit 11 is replaced by the repair circuit 20 for output. In addition, a scan pulse received on the $j^{th}$ stage horizontal scan line 41 in the pixel circuit 40 of the display panel is directly sent by the repair circuit 20, and scanning on the $j^{th}$ stage horizontal scan line 41 is normal.

As shown in FIG. 2 and FIG. 3, in the embodiment of the present invention, the repair circuit 20 includes at least one repair line 21. In an embodiment of the present invention, as shown in FIG. 3, each repair line 21 is arranged between a signal output line 111 of a GOA unit 11 at each stage and a horizontal scan line 41 arranged corresponding to the GOA unit 11 at the stage. In the figure, Addr is an address input end of the GOA unit 11, and OUT is an output end of the GOA unit 11. FIG. 2 and FIG. 3 only show three repair lines 21. In actual application processes, the number of repair lines 21 may be increased or decreased based on product design requirements, and is not limited to the number shown in the figure. It should be noted that, in practice, a larger number of repair lines 21 indicates a larger number of acceptable failure stages a greater potential yield improvement, but a larger area occupied in a frame area. Therefore, the number of repair lines 21 may be comprehensively considered based on product design requirements during product design.

Figure 4:
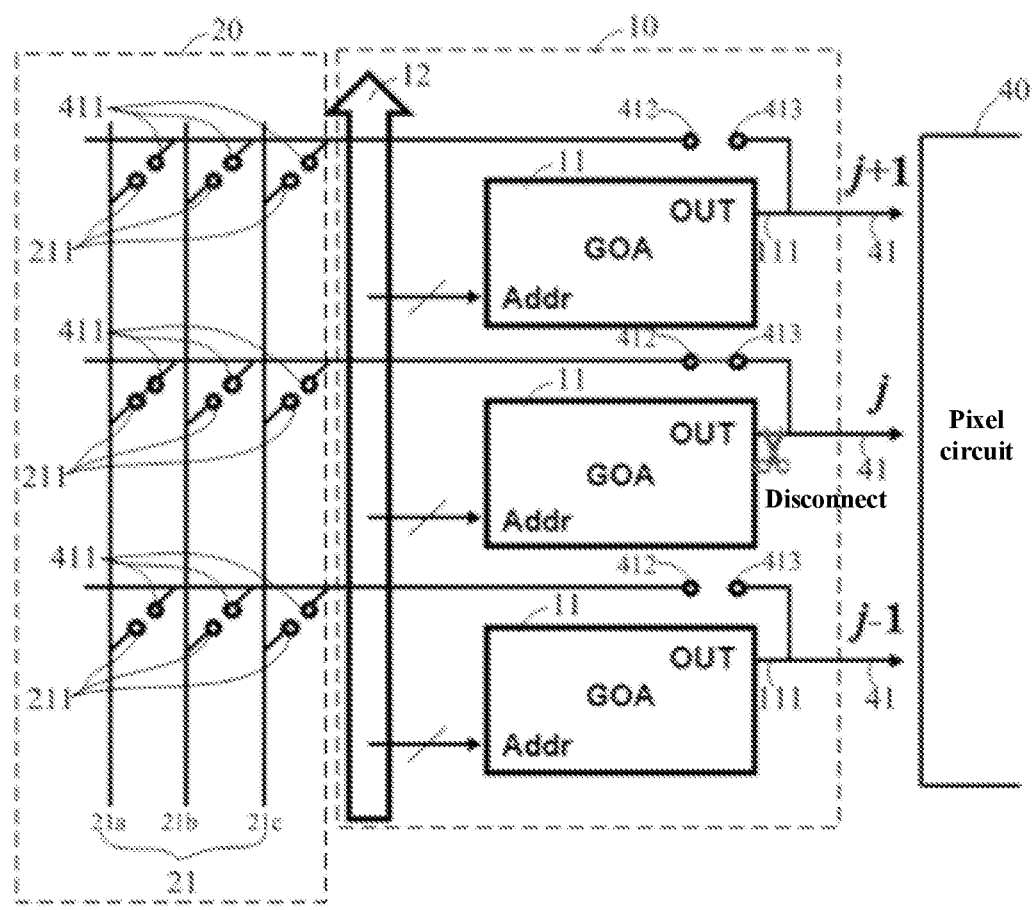
FIG. 4 is a schematic diagram illustrating repair in FIG. 2.

Further, as shown in FIG. 3 and FIG. 4, each repair line 21 is provided with a first interface 211, and each horizontal scan line 41 is provided with a second interface 411.

When the GOA unit 11 at each stage operates normally, there is no connection between the first interface 211 and the second interface 411, i.e., the first interface 211 is not connected to the second interface 411; when the $j^{th}$ stage GOA unit 11 in the GOA circuit 10 is abnormal, the signal output line 111 of the $j^{th}$ stage GOA unit 11 is disconnected from the $j^{th}$ stage horizontal scan line 41 by using repair operations described below, and the first interface 211 of any one of unoccupied repair lines 21 is connected to the second interface 411 of the $j^{th}$ stage horizontal scan line 41.

As shown in FIG. 2, when the repair circuit 20 is located on the left side of the GOA circuit 10 (i.e., between an edge of the display panel and the GOA circuit 10), each horizontal scan line 41 is further provided with a third interface 412 and a fourth interface 413. During the production process of products and before the process proceeds to the backplane inspection step, the first interface 211 and the second interface 411 are both in a disconnected state; and the third interface 412 and the fourth interface 413 are also in the disconnected state. During the backplane inspection of the products, a GOA unit 11 with a failure can be identified.

Figure 5:
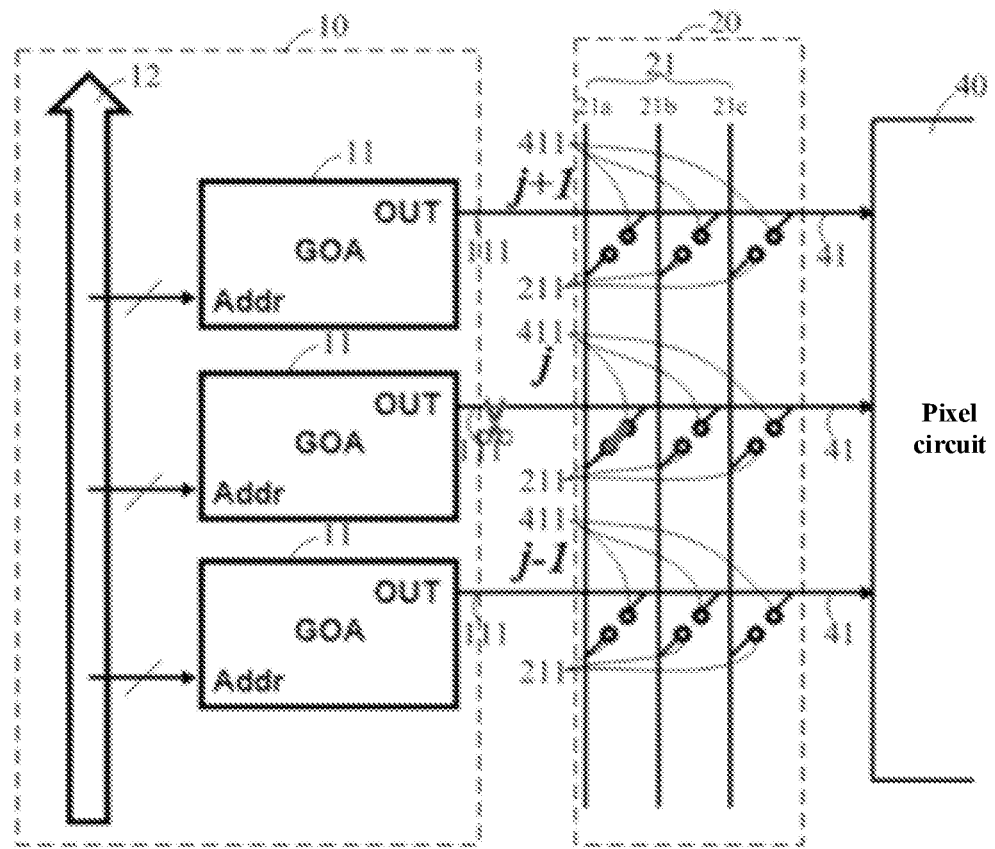
FIG. 5 is a schematic diagram illustrating repair in FIG. 3.

As shown in FIG. 4 and FIG. 5, it is assumed that the repair line 21 of the repair circuit 20 includes three repair lines, 21a, 21b, and 21c. When an output failure of the $j^{th}$ stage GOA unit 11 is detected in the backplane inspection phase, assuming that a first repair line (21a in FIG. 4 and FIG. 5) in the repair line 21 in the repair circuit 20 is not occupied, in the repair phase, the $j^{th}$ stage output line is disconnected (i.e., the signal output line 111 of the $j^{th}$ stage GOA unit is disconnected from the $j^{th}$ stage horizontal scan line 41), and the first interface 211 of the first repair line (21a) is connected to the second interface 411 of the $j^{th}$ stage horizontal scan line 41, and the third interface 412 and the fourth interface 413 of the $j^{th}$ stage horizontal scan line 41 are connected to each other to complete the repair.

Therefore, when the GOA unit 11 at each stage in the GOA circuit 10 operates normally, the driver IC (30) outputs an address signal to the address bus 12 in the GOA circuit 10, to gate a GOA unit 11 corresponding to the address signal, and drive the GOA unit 11 to output a driving signal to a horizontal scan line 41 arranged corresponding to the GOA unit 11. The gated GOA unit 11 normally outputs the driving signal to its corresponding the horizontal scan line 41, and transmits the driving signal to a row corresponding to the GOA unit 11 in the pixel circuit 40 through the horizontal scan line 41 to complete scanning.

When the $j^{th}$ stage GOA unit 11 in the GOA circuit 10 is abnormal, because the output end of the $j^{th}$ stage GOA unit 11 has been disconnected and the $j^{th}$ stage horizontal scan line 41 has been connected to any one of the unoccupied repair lines 21 in the repair circuit 20 in the repair phase, the driver IC (30) outputs a redundant address signal, so that the $j^{th}$ stage GOA unit 11 has no output signal; at the same time, the driver IC (30) outputs a driving signal to the repair circuit 20, transmits the driving signal to the $j^{th}$ stage horizontal scan line 41 through the unoccupied repair line 21 in the repair circuit 20, and transmits the driving signal to the row corresponding to the $j^{th}$ stage GOA unit 11 in the pixel circuit 40 through the $j^{th}$ stage horizontal scan line 41.

Specifically, as shown in FIG. 4 and FIG. 5, because the first interface 211 of the first repair line (21a) has been connected to the second interface 411 of the $j^{th}$ stage horizontal scan line 41 (the third interface 412 and the fourth interface 413 have also been connected to each other in FIG. 4) in the repair phase, and the signal output line 111 of the $j^{th}$ stage GOA unit 11 has been disconnected from the $j^{th}$ stage horizontal scan line 41, in a subsequent driving process, the driver IC (30) may replace a normal address with a redundant address at an address input end (Addr) when the $j^{th}$ stage GOA unit 11 operates, so that the output end (OUT) of the $j^{th}$ stage GOA unit 11 has no output signal, and a driving signal is sent to the first repair line (21a) such that the first repair line (21a) sends the driving signal to the $j^{th}$ stage horizontal scan line 41 and transmits the driving signal to the row corresponding to the $j^{th}$ stage GOA unit 11 in the pixel circuit 40 to complete the scanning. In the embodiment of the present invention, the signal output line 111 of the $j^{th}$ stage GOA unit 11 may be disconnected by using a laser repair machine.

Figure 6:
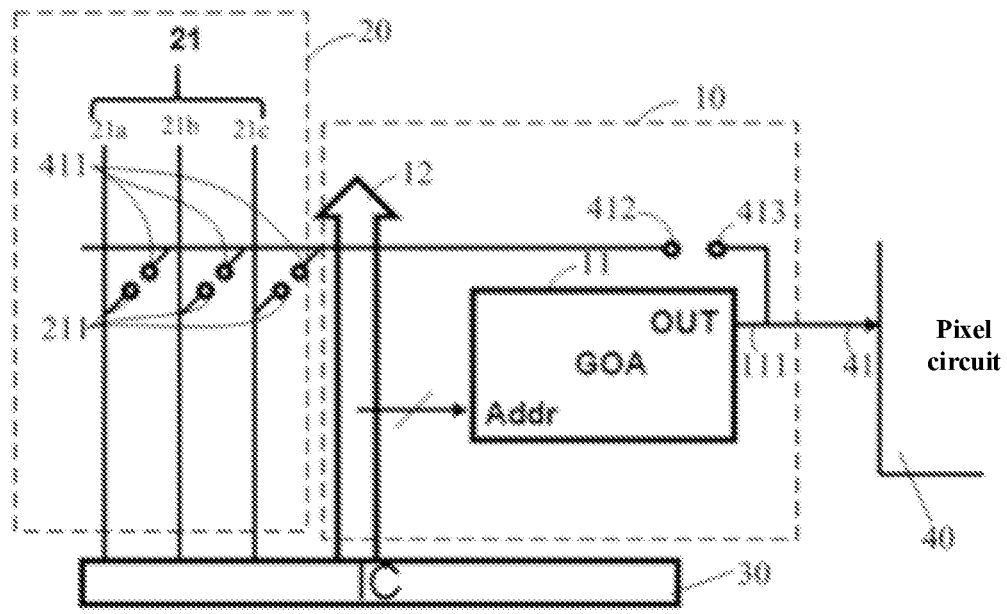
FIG. 6 is a conceptual circuit diagram illustrating embodiment 1 of a repairable GOA drive system according to the present invention.
Figure 7:
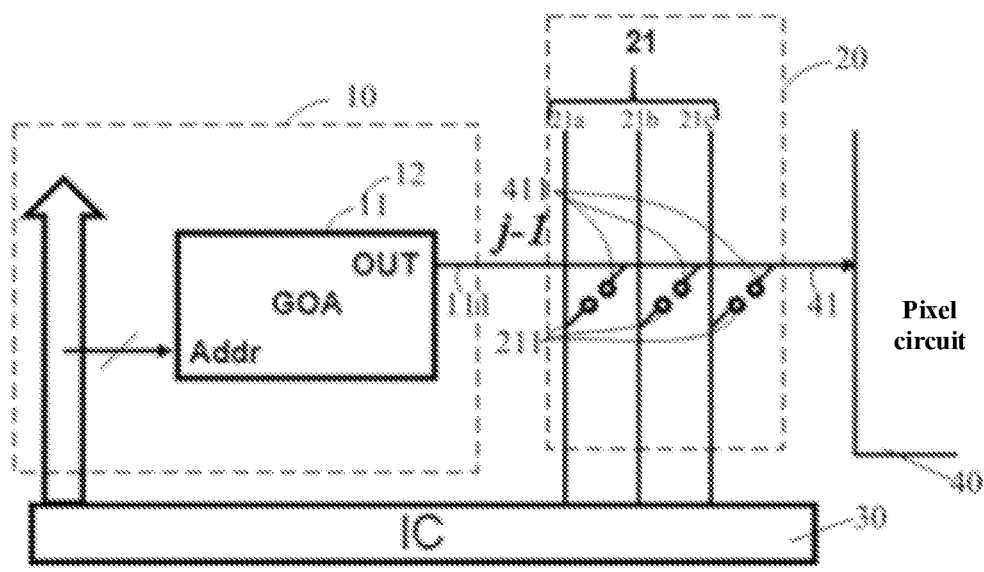
FIG. 7 is a conceptual circuit diagram illustrating embodiment 2 of a repairable GOA drive system according to the present invention.

FIG. 6 and FIG. 7 are schematic diagrams illustrating circuit connections between the driver IC (30) and the repair circuit 20 and the GOA circuit 10.

To coordinate with the repair, the present invention provides a novel repair logic module 301 arranged in the driver IC (30). Specifically, FIG. 8 is a conceptual block diagram illustrating the repair logic module 301 according to an embodiment of the present invention.

Figure 8:
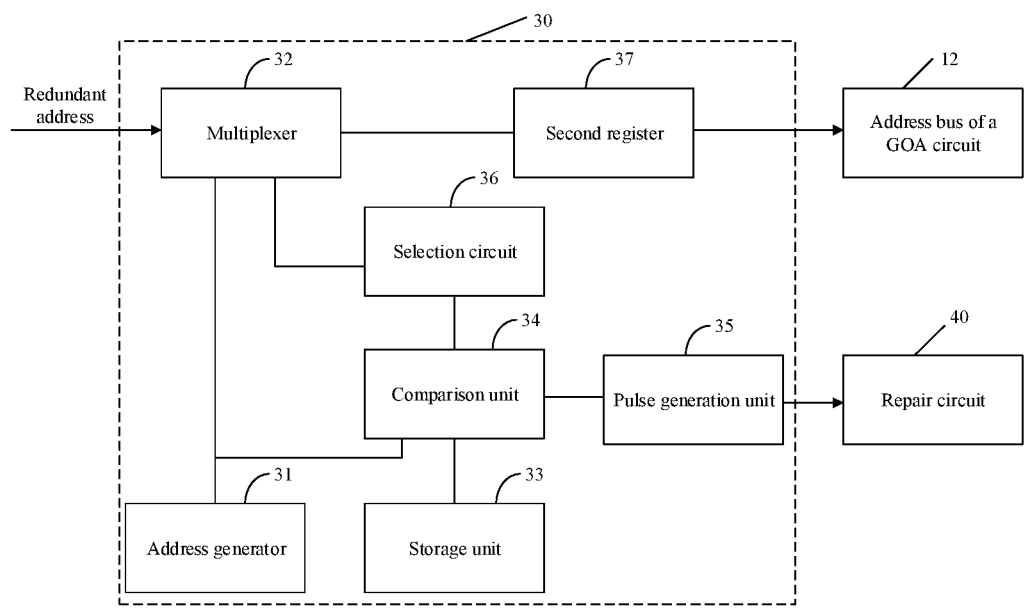
FIG. 8 is a conceptual block diagram illustrating a repair logic module in a driver IC according to an embodiment of the present invention.

As shown in FIG. 8, the repair logic module 301 in the driver IC (30) provided by the embodiment of the present invention includes an address generator 31, a multiplexer 32, a storage unit 33, a comparison unit 34, a pulse generation unit 35, and a selection circuit 36.

An output end of the address generator 31 is respectively connected to a first input end of the multiplexer 32 and a first input end of the comparison unit 34, a second input end of the multiplexer 32 is connected to a redundant address, and an output end of the multiplexer 32 is connected to an input end of the address bus 12 of the GOA circuit 10; a second input end of the comparison unit 34 is connected to the storage unit 33, an output end of the comparison unit 34 is respectively connected to an input end of the selection circuit 36 and an input end of the pulse generation unit 35, an output end of the pulse generation unit 35 is connected to the pixel circuit 40, and an output end of the selection circuit 36 is connected to a third input end of the multiplexer 32.

Figure 9:
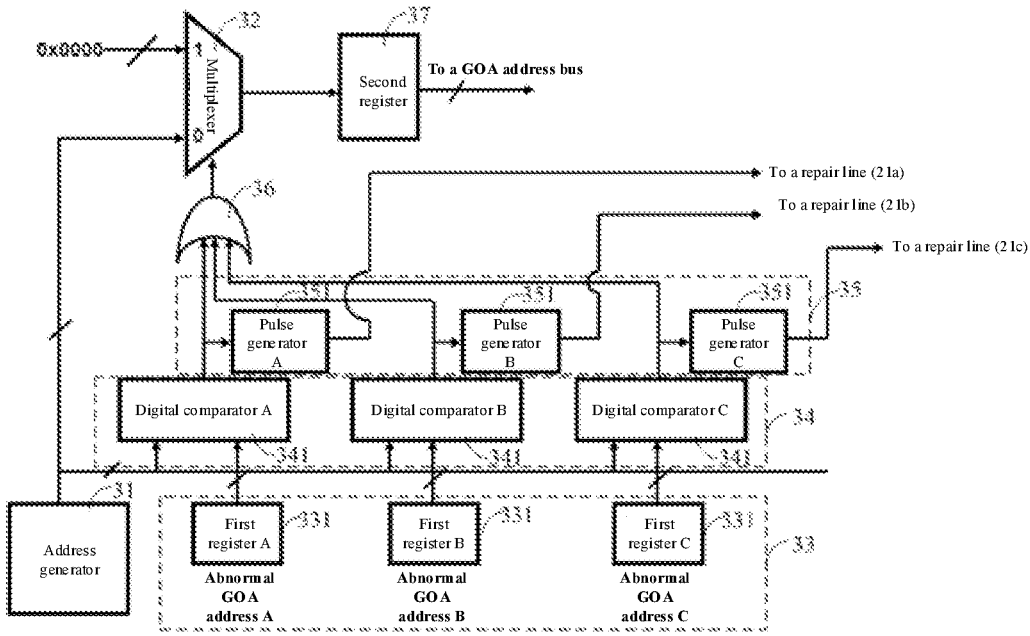
FIG. 9 is a conceptual circuit diagram illustrating a driver IC in a repairable GOA drive system according to the present invention.

Optionally, as shown in FIG. 9, in the embodiment of the present invention, the storage unit 33 includes first registers 331, the comparison unit 34 includes digital comparators 341 arranged corresponding to the first register 331, and the pulse generation unit 35 includes pulse generators 351 arranged corresponding to the digital comparator 341.

The selection circuit 36 includes but is not limited to an OR gate. It can be understood that, when only one repair line 21 is provided in the repair circuit 20, the selection circuit 36 may be omitted.

First input ends of the digital comparators 341 are each connected to the output end of the address generator 31, second input ends of the digital comparators 341 are each connected to the correspondingly arranged first register 331, output ends of the digital comparators 341 are each connected to an input end of the selection circuit 36 and an input end of the correspondingly arranged pulse generator 351, and output ends of the pulse generators 351 are each connected to a repair line 21 correspondingly arranged in the pixel circuit 40.

Herein, it should be noted that, when a plurality of repair lines 21 are present in the repair circuit 20, a plurality of first registers 331 may be provided corresponding to the repair lines 21, and each first register 331 stores an abnormal address. Similarly, a plurality of digital comparators 341 and a plurality of pulse generators 351 are also provided corresponding to the repair lines 21. As shown in FIG. 9, assuming that three repair lines 21 are present in the repair circuit 20, three first registers 331 may be provided, which are a first register A, a first register B, and a first register C. When the system is started, the first register A, the first register B, and the first register C read, from a non-volatile memory operating in conjunction with the driver IC (30), an abnormal address A, an abnormal address B, and an abnormal address C that are pre-stored in a screen repair phase. Digital comparators A, B and C are arranged corresponding to the first registers A, B and C, respectively, and pulse generators A, B and C are arranged corresponding to the digital comparators A, B, and C, respectively.

The abnormal addresses A, B, and C are detected in the inspection phase and pre-stored in the non-volatile memory that operates in conjunction with the driver IC (30). The non-volatile memory includes but is not limited to a flash memory or a ROM.

One of the branches is used as an example (which includes the first register A, the digital comparator A, and the pulse generator A) to describe the driving process of the driver IC (30):

First, a reserved redundant address is allocated to a row scan line corresponding to an abnormal GOA unit, and the redundant address does not correspond to an address of any GOA unit. The address generator 31 outputs an address signal at a preset cycle, and the address signal is separately sent to the first input end of the multiplexer 32 and a first input end of the digital comparator A; the digital comparator A compares the address signal received by the first input end with the abnormal address A received by the second input end; and if the current address is different from the abnormal address A, the digital comparator A outputs a first control signal; or if the current address is the same as the abnormal address A, the digital comparator A outputs a second control signal. In the embodiment of the present invention, the first control signal is denoted by "0", and the second control signal is denoted by "1".

An output result of the digital comparator A determines an output of the multiplexer 32. If the digital comparator A outputs the first control signal (i.e., an output end of the digital comparator A outputs 0), the first control signal is sent to the third input end of the multiplexer 32 through the selection circuit 36, and then the multiplexer 32 allows the current address to pass, i.e., the address signal received from the first input end of the multiplexer 32 is sent to the address bus 12 of the GOA circuit 10, to gate a GOA unit 11 corresponding to the current address. If the digital comparator A outputs the second control signal (i.e., the output end of the digital comparator A outputs 1), a GOA unit 11 corresponding to the current address is an abnormal GOA unit 11, and the second control signal is sent to the third input end of the multiplexer 32 through the selection circuit 36; the multiplexer 32 outputs the redundant address (0x0000 shown in FIG. 9) connected to the second input end, and sends the redundant address to the address bus 12 of the GOA circuit 10. Because the preset redundant address does not correspond to any GOA unit 11 in the GOA circuit 10, it does not cause any GOA unit 11 to send a driving signal.

Further, the first control signal or the second control signal output from the output end of the digital comparator A is also sent to the pulse generator A at the same time. Therefore, if an output from the output end of the digital comparator A is 0, the pulse generator A is not triggered and no driving signal enters the first repair line (21a); or if the output from the output end of the digital comparator A is 1, i.e., the GOA unit 11 corresponding to the current address is abnormal, the pulse generator A outputs a driving signal to the first repair line (21a), and sends the driving signal to a horizontal scan line 41 arranged corresponding to the abnormal GOA through the first repair line (21a). In other words, in this mode, a pulse signal of a row scan line corresponding to the damaged GOA unit is directly generated by the repair logic module, and does not pass through any GOA unit.

It should be noted that, the preceding description is provided based on only one branch, and it can be understood that the working processes of other branches are the same as that of the above-mentioned branch. When a plurality of branches are available for the repair and driving, a signal can be selected by the selection circuit 36 and output to the multiplexer 32.

In conclusion, the driver IC (30) of the present invention can achieve the following effects: If a GOA unit 11 corresponding to the current row to be scanned is normal, the driver IC (30) will output a normal address signal to drive the GOA of the current row to send a normal driving signal; or if the GOA unit 11 corresponding to the current row to be scanned is abnormal, the driver IC (30) will output a redundant address to suppress an output signal of the GOA unit 11 corresponding to the current row and send a driving signal to a spare repair line 21. As mentioned above, because the horizontal scan line 41 of the row corresponding to the abnormal GOA unit 11 has been connected to the spare repair line 21 in the repair phase, the driving signal output by the driver IC (30) instead of an output of the abnormal GOA unit 11 can enter the corresponding row in the pixel circuit 40 through the spare repair line 21.

Further, as shown in FIG. 9, the driver IC (30) in the embodiment of the present invention may further include: a second register 37, connected between the output end of the multiplexer 32 and the input end of the address bus 12 of the GOA circuit 10 and configured to deburr an address signal output by the multiplexer 32.

Further, the driver IC (30) in the embodiment of the present invention further includes a voltage conversion unit and an output buffer unit. Specifically, an input end of the voltage conversion unit is connected to the output end of the pulse generation unit 35, an output end of the voltage conversion unit is connected to an input end of the output buffer unit, and an output end of the output buffer unit is connected to the pixel circuit 40. The voltage conversion unit and the output buffer unit may be used as standard components of the driver IC (30), and may be added to the output end of the pulse generation unit 35 based on actual needs during an IC design. The voltage conversion unit and the output buffer unit are not illustrated in FIG. 9 of the present invention.

Optionally, in the embodiment of the present invention, the driver IC (30) may further include a redundant memory, configured to store at least one redundant address. The redundant address stored in the redundant memory does not correspond to a GOA unit 11 at any stage in the GOA circuit 10. Certainly, it can be understood that, the redundant address in the embodiment of the present invention may be dynamically generated by combinational logic, and does not necessarily need to occupy memory space.

Figure 10:
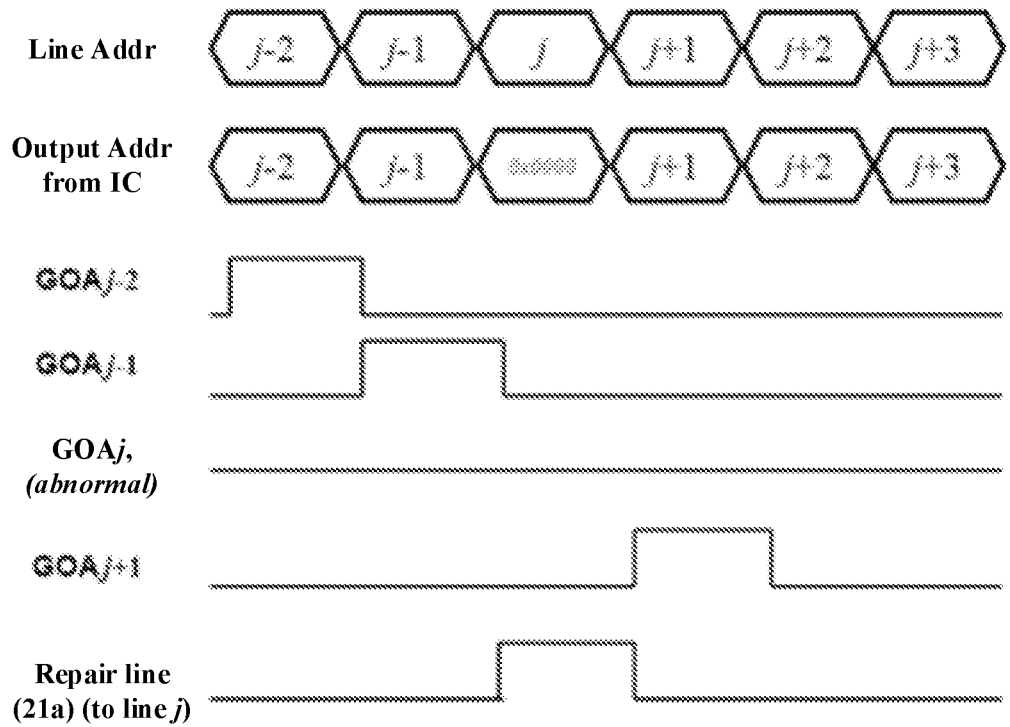
FIG. 10 is a sequence diagram illustrating driver IC and panel signals in a repairable GOA drive system according to the present invention.

FIG. 10 is a sequence diagram illustrating driver IC (30) and panel signals in a repairable GOA drive system according to an embodiment of the present invention.

It can be seen from FIG. 10 that, output of the abnormal $j^{th}$ stage GOA unit 11 is replaced by a driving signal on the spare first repair line (21a), the $j^{th}$ stage horizontal scan line 41 of the display panel receives the driving signal sent from the first repair line (21a), and the $j^{th}$ row of the display panel is normally scanned.

It can be understood that, the repair logic module 301 may not need to be integrated in the driver IC (30), but is arranged near the GOA circuit 10 as a separate piece of hardware.

The present invention further provides a display panel, including the above-mentioned repairable GOA drive system.

Figure 11:
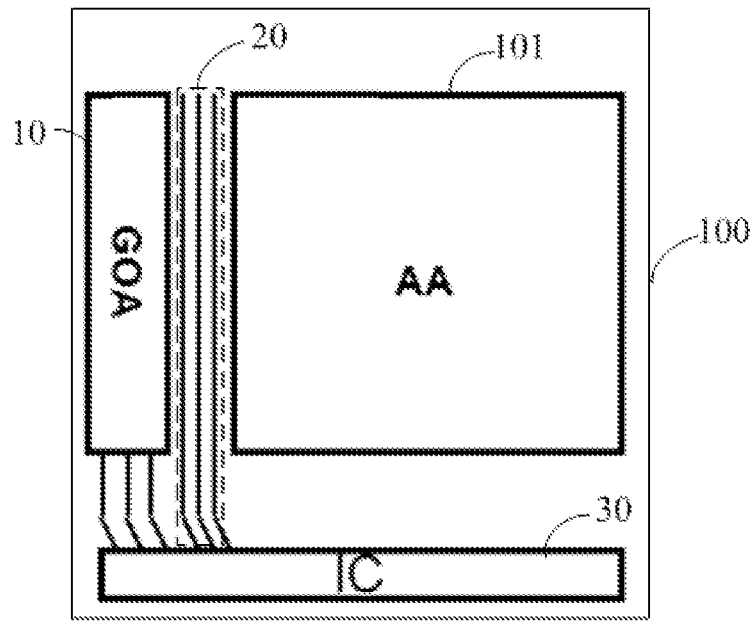
FIG. 11 to FIG. 14 are schematic diagrams illustrating several positions of repair circuits surrounding an entire display panel according to the present invention.

As shown in FIG. 11, the display panel includes a panel substrate 100, a display area 101 disposed on the panel substrate 100, a GOA circuit 10, a repair circuit 20, and a driver IC (30) connected to the GOA circuit 10 and the repair circuit 20, where the GOA circuit 10, the repair circuit 20, and the driver IC (30) are disposed on the panel substrate 100.

Figure 12:
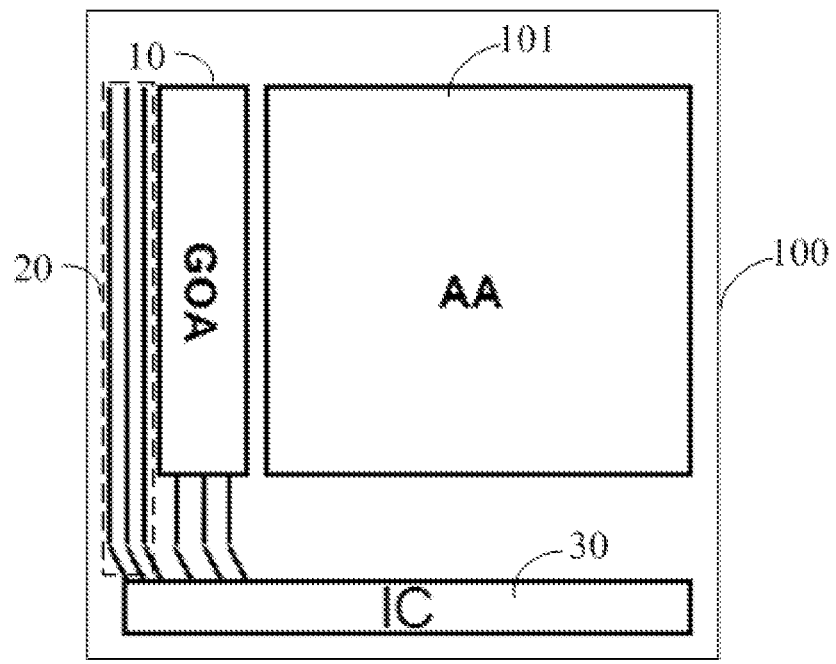

The display area 101 is located in a middle position of the panel substrate 100, and an area between the periphery of the display area 101 and an edge of the panel substrate 100 forms a frame area; the GOA circuit 10 is arranged in the frame area; and the repair circuit 20 is arranged in the frame area and between the GOA circuit 10 and the display area 101. Alternatively, as shown in FIG. 12, the GOA circuit 10 is arranged between the repair circuit 20 and the display area 101.

Figure 13:
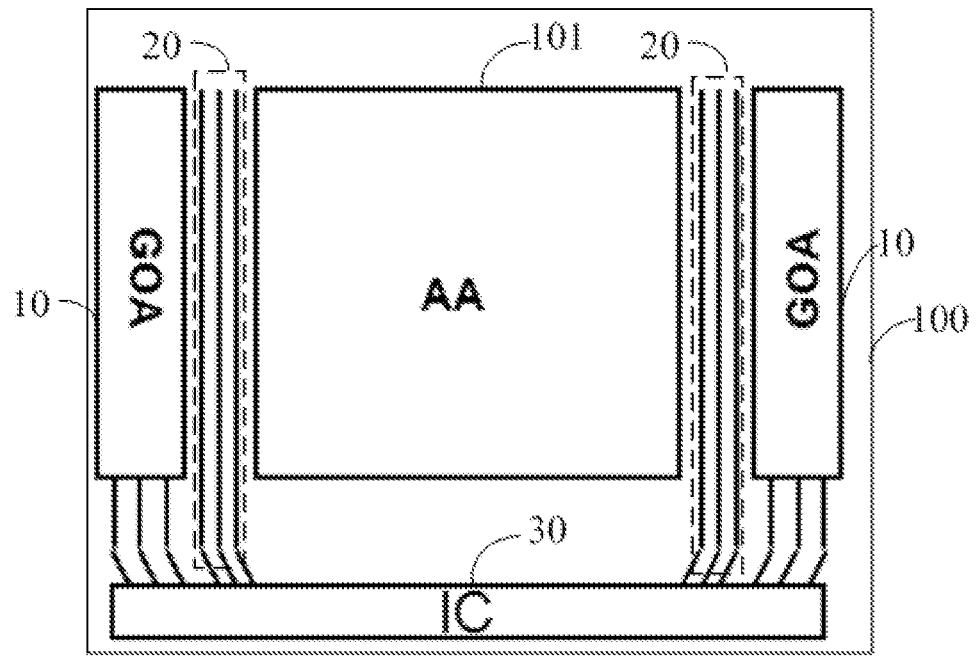

As shown in FIG. 13, the display panel includes a panel substrate 100, a display area 101 disposed on the panel substrate 100, two GOA circuits 10, two repair circuits 20, and a driver IC (30) connected to the GOA circuits 10 and the repair circuit 20, where the two GOA circuits 10, the two repair circuits 20, and the driver IC (30) are disposed on the panel substrate 100.

The display area 101 is located in a middle position of the panel substrate 100, and an area between the periphery of the display area 101 and an edge of the panel substrate 100 forms a frame area; the two repair circuits 20 are arranged in the frame area on two opposite sides of the display area 101, and the two GOA circuits 10 are each arranged between the repair circuit 20 and the display area 101.

Figure 14:
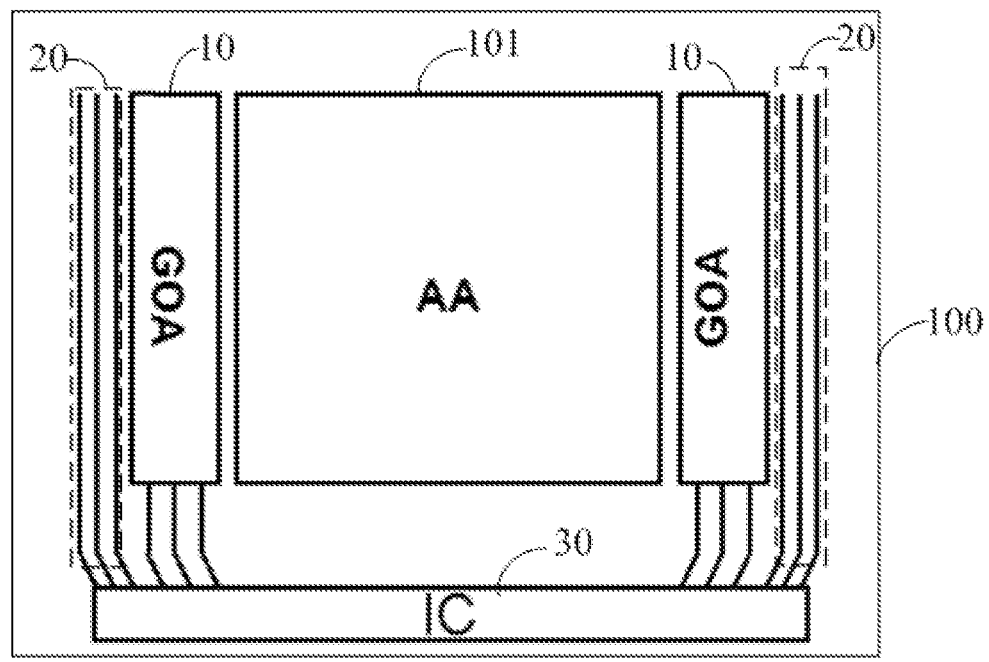

Alternatively, as shown in FIG. 14, the two GOA circuits 10 are arranged in the frame area on two opposite sides of the display area 101, and the two repair circuits 20 are each arranged between the GOA circuit 10 and the display area 101.

Figure 15:
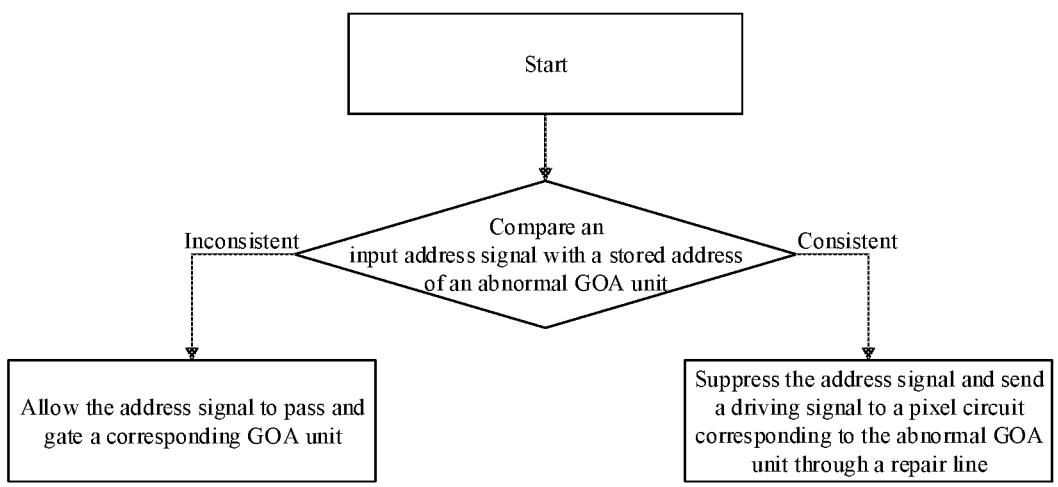
FIG. 15 is a schematic flowchart illustrating a driving method for a repaired GOA circuit according to an embodiment of the present invention.

As shown in FIG. 15, an embodiment of the present invention further provides a driving method for a repaired GOA circuit, which can be applied to the above-mentioned repairable GOA drive system.

Specifically, the driving method for a repaired GOA circuit includes the following steps:

comparing an input address signal with a stored address of an abnormal GOA unit; and when the input address signal is inconsistent with the address of the abnormal GOA unit:

allowing the address signal to pass and gating a corresponding GOA unit; or when the input address signal is consistent with the address of the abnormal GOA unit:

suppressing the address signal and sending a driving signal to a pixel circuit corresponding to the abnormal GOA unit through a repair line.

Further, the driving method for a repaired GOA circuit in the embodiment of the present invention further includes:

when the input address signal is consistent with the address of the abnormal GOA unit: recording the address of the abnormal GOA unit, and storing the address of the abnormal GOA unit in a non-volatile memory that operates in conjunction with the driver IC.

Further, in the embodiment of the present invention, the suppressing the address signal and sending a driving signal to a pixel circuit corresponding to the abnormal GOA unit through a repair line specifically includes:

inputting a redundant address signal and suppressing the address signal by using the redundant address signal; and outputting a driving signal to a repair line, and sending the driving signal to the pixel circuit corresponding to the abnormal GOA unit through the repair line.

Further, in the embodiment of the present invention, the inputting a redundant address signal and suppressing the address signal by using the redundant address signal; and outputting a driving signal to a repair line, and sending the driving signal to the pixel circuit corresponding to the abnormal GOA unit through the repair line specifically includes:

disconnecting a signal output line of the abnormal GOA unit from a horizontal scan line arranged corresponding to the abnormal GOA unit; and adjusting a connection status between any unoccupied one of the repair lines and the horizontal scan line arranged corresponding to the abnormal GOA unit from a disconnected state to a connected state, and marking the selected repair line as being occupied.

In the embodiment of the present invention, the repaired GOA circuit used in the driving method for a repaired GOA circuit includes a driver IC. Optionally, the driver logic includes a repair logic module, and the repair logic module includes an address generator, a comparison unit, a pulse generation unit, and a multiplexer. The driving method for a repaired GOA circuit includes the following steps:

The address generator outputs an address signal at a preset cycle.

The comparison unit receives the address signal, compares the address signal with the stored address of the abnormal GOA unit, and outputs a comparison signal based on a comparison result.

The pulse generation unit receives the comparison signal, and adjusts its own operating status based on the comparison signal.

The multiplexer receives the comparison signal, and chooses to output the address signal or the redundant address signal based on the comparison signal.

Further, in the embodiment of the present invention, the comparison signal may include a first control signal or a second control signal.

Specifically, if the address signal is different from the address of the abnormal GOA unit, the comparison unit outputs the first control signal; or if the address signal is the same as the address of the abnormal GOA unit, the comparison unit outputs the second control signal.

Further, if the comparison unit outputs the first control signal, the pulse generation unit receives the first control signal, and performs a no-output operation based on the first control signal; or if the comparison unit outputs the second control signal, the pulse generation unit receives the second control signal, and generates a pulse scan signal based on the second control signal, where the pulse scan signal is the driving signal.

In the embodiment of the present invention, if the comparison unit outputs the second control signal, the multiplexer receives the second control signal, outputs a redundant address signal based on the second control signal, and suppresses an output signal of the abnormal GOA unit by using the redundant address signal.

According to the present invention, the repairable GOA drive system is arranged in the display panel. A GOA circuit structure including a plurality of stages of mutually independent GOA units is adopted, so that the stages are independent of each other in an electrical design, a dependency relationship between former and latter stages is removed, and a defect of a former stage does not lead to a defect of a latter stage; a failure of a single-stage GOA unit can be identified and repaired in electrical inspection after a backplane is completed; moreover, a repair process is simple and highly operable, and additional requirements for the driver IC are simple and highly implementable; and the present invention can greatly improve repairability of backplane circuits with a GOA and increase the screen yield in mass production.

The preceding embodiments are merely used to illustrate the technical concept and features of the present invention, and are intended to enable a person skilled in the art to understand the content of the present invention and implement the present invention accordingly, but not limit the protection scope of the present invention. All equivalent changes and modifications made within the scope of the claims of the present invention shall fall within the scope of the claims of the present invention.

It should be understood that, a person of ordinary skills in the art may make improvements or replacements based on the description above, and all these improvements and replacements shall fall within the protection scope of the appended claims of the present invention.

What is claimed is:

1. A repairable GOA drive system, used for a display panel comprising a display area and a pixel circuit arranged in the display area, wherein the repairable GOA drive system comprises a GOA circuit, a repair circuit, and a driver IC, wherein the GOA circuit is connected to a driving signal output end of the driver IC; and the repair circuit is arranged between the driver IC and the pixel circuit, and configured to replace at least one abnormal GOA unit in the GOA circuit to output a driving signal to a corresponding pixel circuit when the at least one GOA unit is abnormal, wherein GOA units of the GOA circuit are independent of each other, and each of the GOA units is independently driven by the driver IC via an address bus, wherein a $j^{th}$ stage GOA unit of the GOA circuit correspondingly controls a $j^{th}$ stage horizontal scan line of the pixel circuit in the display area, and j is any integer greater than or equal to 1, wherein the repair circuit is arranged between the pixel circuit and a signal output line of each of the GOA units, and when the $j^{th}$ stage GOA unit in the GOA circuit is abnormal, the $j^{th}$ stage GOA unit is disconnected, and the repair circuit is used to replace the disconnected GOA unit for output, and wherein the repair circuit comprises one or more repair lines, and each of the repair lines is arranged between a signal output line of the GOA unit at each stage and a horizontal scan line arranged corresponding to the GOA unit at a corresponding stage.

2. The repairable GOA drive system according to claim 1, wherein each of the repair lines is provided with a first interface, and each of the horizontal scan lines is provided with a second interface; wherein when the GOA units operate normally, the first interface is disconnected from the second interface; and when the $j^{th}$ stage GOA unit in the GOA circuit is abnormal, the signal output line of the $j^{th}$ stage GOA unit is disconnected from the $j^{th}$ stage horizontal scan line, and the first interface of one of the repair lines is connected to the second interface of the $j^{th}$ stage horizontal scan line.

3. The repairable GOA drive system according to claim 1, wherein when the GOA units of the GOA circuit operate normally, the driver IC outputs an address signal to the GOA circuit, to drive a GOA unit corresponding to the address signal to output a driving signal to a horizontal scan line corresponding to the GOA unit.

4. The repairable GOA drive system according to claim 2, wherein when the $j^{th}$ stage GOA unit in the GOA circuit is abnormal, the driver IC outputs a redundant address signal to suppress outputting signal of the $j^{th}$ stage GOA unit, and outputs a driving signal to the repair circuit, to transmit the driving signal to the $j^{th}$ stage horizontal scan line through the repair circuit.

5. The repairable GOA drive system according to claim 1, wherein the driver IC comprises a repair logic module, and the repair logic module comprises an address generator, a multiplexer, a storage unit, a comparison unit, and a pulse generation unit;

an output end of the address generator is respectively connected to a first input end of the multiplexer and a first input end of the comparison unit, a second input end of the multiplexer is connected to a redundant address, and an output end of the multiplexer is connected to the GOA circuit; and a second input end of the comparison unit is connected to the storage unit, an output end of the comparison unit is respectively connected to a third input end of the multiplexer and an input end of the pulse generation unit, and an output end of the pulse generation unit is connected to a repair line correspondingly arranged in the pixel circuit.

6. The repairable GOA drive system according to claim 5, wherein the repair logic module further comprises a selection circuit; and an input end of the selection circuit is connected to the output end of the comparison unit, and an output end of the selection circuit is connected to the third input end of the multiplexer.

7. The repairable GOA drive system according to claim 5, wherein the storage unit comprises a first register, the comparison unit comprises a digital comparator arranged corresponding to the first register, and the pulse generation unit comprises a pulse generator arranged corresponding to the digital comparator; and a first input end of the digital comparator is connected to the output end of the address generator, a second input end of the digital comparator is connected to the correspondingly arranged first register, an output end of the digital comparator is respectively connected to the third input end of the multiplexer and an input end of the correspondingly arranged pulse generator, and an output end of the pulse generator is connected to a repair line correspondingly arranged in the pixel circuit.

8. The repairable GOA drive system according to claim 5, wherein the driver IC further comprises a voltage conversion unit and an output buffer unit; and an input end of the voltage conversion unit is connected to the output end of the pulse generation unit, an output end of the voltage conversion unit is connected to an input end of the output buffer unit, and an output end of the output buffer unit is connected to a repair line correspondingly arranged in the pixel circuit.

9. The repairable GOA drive system according to claim 5, wherein at least one redundant address is further preset in the driver IC; and the at least one redundant address does not correspond to any GOA unit in the GOA circuit.

10. A driving method for repairing a GOA circuit, comprising:

comparing an input address signal with a stored address of an abnormal GOA unit; and when the input address signal is inconsistent with the address of the abnormal GOA unit:
allowing the address signal to pass and gating a corresponding GOA unit; or when the input address signal is consistent with the address of the abnormal GOA unit:
suppressing the address signal and sending a driving signal to a pixel circuit corresponding to the abnormal GOA unit through a repair line, and recording the address of the abnormal GOA unit, and storing the address of the abnormal GOA unit in a non-volatile memory that operates in conjunction with the driver IC.

11. The driving method for repairing a GOA circuit according to claim 10, wherein the suppressing the address signal and sending a driving signal to a pixel circuit corresponding to the abnormal GOA unit through a repair line specifically comprises:

inputting a redundant address signal to suppress the address signal; and outputting a driving signal to a repair line, and sending the driving signal to the pixel circuit corresponding to the abnormal GOA unit through the repair line.

12. The driving method for repairing a GOA circuit according to claim 11, wherein the inputting a redundant address signal and suppressing the address signal by using the redundant address signal; and outputting a driving signal to a repair line, and sending the driving signal to the pixel circuit corresponding to the abnormal GOA unit through the repair line specifically comprises:

disconnecting a signal output line of the abnormal GOA unit from a horizontal scan line arranged corresponding to the abnormal GOA unit; and adjusting a connection status between any one of unoccupied repair lines and the horizontal scan line arranged corresponding to the abnormal GOA unit from a disconnected state to a connected state, and marking the selected repair line as being occupied.

13. The driving method for repairing a GOA circuit according to claim 12, wherein the repaired GOA circuit comprises the driver IC, the driver IC comprises a repair logic module, and the repair logic module comprises an address generator, a comparison unit, a pulse generation unit, and a multiplexer; the driving method comprises:

outputting an address signal at a preset cycle by the address generator;

receiving the address signal, comparing the address signal with the stored address of the abnormal GOA unit, and outputting a comparison signal based on a comparison result by the comparison unit;

receiving the comparison signal, and adjusting its own operating status based on the comparison signal by the pulse generation unit; and receiving the comparison signal, and choosing to output the address signal or the redundant address signal based on the comparison signal by the multiplexer;

the comparison signal comprises a first control signal or a second control signal; and if the address signal is different from the address of the abnormal GOA unit, outputting the first control signal by the comparison unit; or if the address signal is the same as the address of the abnormal GOA unit, outputting the second control signal by the comparison unit.

14. A display panel, comprising a panel substrate, a display area disposed on the panel substrate and a repairable GOA drive system disposed on the panel substrate, the repairable GOA drive system comprises a GOA circuit, a repair circuit, and a driver IC connected to the GOA circuit and the repair circuit, wherein the GOA circuit is connected to a driving signal output end of the driver IC; and the repair circuit is arranged between the driver IC and the pixel circuit, and configured to replace at least one abnormal GOA unit in the GOA circuit to output a driving signal to a corresponding pixel circuit when the at least one GOA unit is abnormal;

the GOA circuit, the repair circuit, and the driver IC are disposed on the panel substrate;

the display area is located in a middle position of the panel substrate, and an area between the periphery of the display area and an edge of the panel substrate forms a frame area;

the GOA circuit is arranged in the frame area; and the repair circuit is arranged in the frame area and between the GOA circuit and the display area; or the GOA circuit is arranged between the repair circuit and the display area, and further comprising another GOA circuit disposed on the panel substrate and another repair circuit disposed on the panel substrate, the driver IC also connects the another GOA circuit and the another repair circuit, the two repair circuits are arranged in the frame area on two opposite sides of the display area, and the two GOA circuits are each arranged between the repair circuit and the display area; or the two GOA circuits are arranged in the frame area on two opposite sides of the display area, and the two repair circuits are each arranged between the GOA circuit and the display area.

* * * * *